United States Patent [19]

Heilmann et al.

[11] 4,304,705

[45] Dec. 8, 1981

[54] RADIATION-CURABLE POLYMERS CONTAINING PENDANT UNSATURATED PEPTIDE GROUPS DERIVED FROM AZLACTONE POLYMERS

[75] Inventors: Steven M. Heilmann, North St. Paul; Frederick J. Palensky, St. Paul; Jerald K. Rasmussen, Stillwater, all of Minn.

[73] Assignee: Minnesota Mining and Manufacturing Company, Saint Paul, Minn.

[21] Appl. No.: 109,192

[22] Filed: Jan. 2, 1980

[51] Int. Cl.$^3$ ............... C08K 5/15; C08K 5/02; C08F 26/06; C08F 226/06
[52] U.S. Cl. ............... 260/30.4 N; 204/159.14; 428/260; 428/441; 428/461; 428/500; 525/279; 525/303; 525/283; 526/260; 526/263; 526/264
[58] Field of Search ............... 526/263, 260; 260/33.4 R, 30.4 N, 33.6 UA, 31.2 N; 525/279

[56] References Cited

U.S. PATENT DOCUMENTS

| | | | |
|---|---|---|---|
| 3,448,089 | 6/1969 | Celeste | 525/286 |
| 3,488,327 | 1/1970 | Kollinsky et al. | 260/31.2 N |
| 3,511,894 | 5/1970 | Markert | 526/260 |
| 3,583,950 | 6/1971 | Kollinsky et al. | 526/260 |
| 3,598,790 | 8/1971 | Kollinsky et al. | 260/33.6 UA |
| 3,948,866 | 4/1976 | Pennewiss et al. | 526/260 |
| 4,157,418 | 6/1979 | Heilmann | 526/263 |

FOREIGN PATENT DOCUMENTS

| | | | |
|---|---|---|---|
| 1130438 | 10/1968 | United Kingdom | 525/279 |
| 1202119 | 8/1970 | United Kingdom | 526/260 |

*Primary Examiner*—Paul Lieberman
*Assistant Examiner*—Herbert J. Lilling
*Attorney, Agent, or Firm*—Cruzan Alexander; Donald M. Sell; Lorraine R. Sherman

[57] ABSTRACT

A composition comprising a radiation-curable polymer, said polymer being crosslinkable and having pendant ethylenically unsaturated peptide groups is disclosed. Such polymers are useful in the field of graphic arts.

14 Claims, No Drawings

RADIATION-CURABLE POLYMERS CONTAINING PENDANT UNSATURATED PEPTIDE GROUPS DERIVED FROM AZLACTONE POLYMERS

FIELD OF THE INVENTION

This invention relates to energy-sensitive polymers which may, for example, be radiation sensitive and electron beam sensitive. These polymers may be useful in imaging systems such as are used in graphic arts.

DESCRIPTION OF THE PRIOR ART

Energy-sensitive materials have been used in the field of graphic arts for many years. For such materials to function effectively, it is desirable that the energy sensitive composition comprises a polymer which crosslinks and becomes insoluble in developing solvents on exposure to radiation yet remains soluble in unexposed areas. Furthermore, it is desirable for maximum production efficiency that the period of exposure to radiation be as short as possible. It is also highly desirable that this exposure to actinic radiation occur in a normal air environment to obviate the need for blanketing the reaction with an inert gas such as nitrogen or using an oxygen impermeable top covering in order to overcome the well-known polymerization inhibiting effects of oxygen. A still further requirement is that in the radiation-exposed areas extensive crosslinking in the polymer should occur so that the exposed areas will not swell when the article is subsequently treated with a solvent to dissolve away the still soluble, non-exposed areas.

In the attempt to solve these and other problems apparent to one skilled in the art, resort has been made to utilize polymers having acrylic-functional groups at the ends of the polymer or pendant to the chain of the polymer. The polymer art is replete with descriptions of polymers having two terminal acrylic-functional groups, examples of which are U.S. Pat. Nos. 3,297,745 and 3,700,643 wherein a polymer formed by the reaction of a diol with two equivalents of a diisocyanate followed by reaction with a hydroxyalkyl acrylate monomer is described. Such polymers with terminal acrylic-functionality generally have a curing rate that is slower and a concentration of acrylic-functionality that is lower than is desirable for use in a negative working energy-sensitive element.

Polymers having a multiplicity of pendant acrylic-functional groups, because of the generally greater number of reactable acrylic groups, have faster curing rates, better curing rates in the presence of oxygen, i.e. in air, and higher crosslink density in the exposed, cured regions which results in better overall resistance to swelling by the developing solvent. U.S. Pat. No. 3,448,089 describes two methods for preparing polymers having pendant acrylic-functional groups. In one of these methods, interpolymers containing pendant epoxy groups are prepared by interpolymerization of, for example, glycidyl acrylate with other free radically polymerizable monomers. The acrylic-functionality is imparted to the interpolymer by a ring opening reaction with acrylic acid. This ring opening reaction, however, requires prolonged reaction times and higher temperatures, e.g. 15 hours in refluxing methyl ethyl ketone solvent. Such stringent reaction conditions are undesirable and can result in premature and inadvertent gelation and cross-linking of the interpolymer. In the other method, interpolymers having pendant carboxylic acid anhydride groups are first prepared by interpolymerization of maleic anhydride, for example, with suitable free radically polymerizable monomers. The interpolymer is then made acrylic-functional by subsequent reaction with a hydroxyalkyl acrylate monomer. While this method permits functionalization at moderate temperatures, its use is limited because polymers generally are difficult to obtain with maleic anhydride and intermonomers other than styrene and vinyl ethers. Furthermore, since a carboxylic acid group is also formed when the hydroxyalkyl acrylate monomer reacts with the pendant anhydride group, the polymer becomes quite water sensitive and adhesion to certain desired substrates can suffer even in only moderately humid environments. Special precautions such as esterification of the carboxyl group must be taken. These precautions necessitate prolonged and involved reaction conditions that add cost to the procedure.

In contrast to the above-mentioned art and its inherent problems involving acrylic-functional groups, the present invention relates to energy-sensitive polymers capable of rapid curing under mild conditions even in the presence of air. These polymers have pendant ethylenically unsaturated units secured to the polymer backbone through peptide groups (hereinafter referred to as "polymers having pendant ethylenically unsaturated peptide groups"). By peptide group is meant a group having at least one

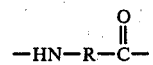

unit, which unit is derived from an amino acid of the general formula

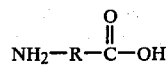

in which R is an aliphatic radical. The polymers may be prepared, as described below, from ethylenically unsaturated azlactone polymers having pendant azlactone groups (4,4-disubstituted-2-oxazolin-5-ones and higher homologues are designated "azlactone" hereinafter).

Reactions of azlactone compounds with nucleophilic compounds are described in the literature, as for example by an article by R. Filler, *Advances in Heterocyclic Chemistry*, Vol. 4, pps. 75-106, A. R. Katritzky, Ed., Academic Press, New York, 1965. There is no apparent discussion of the preparation of energy-curable vinyl polymers from azlactones.

Coatings comprised of diols or diamines and copolymers of 2-alkenyl or 2-acryloyloxyalkyl azlactones and olefinically unsaturated monomers are disclosed in U.S. Pat. No. 3,583,950. Crosslinking is accomplished by heating the coating such that the diol or diamine will cause azlactone ring-opening reactions to occur on two polymer chains. Polymers of that patent are not radiation-curable.

Also, coatings of copolymers of 2-alkenyl- or 2-acryloxyalkyl azlactones with acrylic acid esters and copolymerizable vinylidene compounds having at least one hydroxyl group which crosslink on drying or mild heating are described in U.S. Pat. Nos. 3,488,327 and 3,598,790. Such polymers crosslink by reaction of hydroxyl groups on one chain of the polymer with azlactone groups on other chains. There is no teaching in these patents of polymers having pendant polymerizable ethylenically unsaturated groups.

U.S. Pat. No. 3,511,894 describes a process for making graft polymers by (1) preparing a macromolecule to be grafted, so that it contains pendant azlactone groups, (2) reacting this polymer with an azo group-containing nucleophilic compound to form a macromolecule having polymer-bound azo groups, and (3) heating the azo group-containing macromolecule to liberate nitrogen and form free radical sites on the macromolecule which radicals initiate polymerization of grafting monomer added thereto. U.S. Pat. No. 3,948,866 also discloses graft polymers for use as special stabilizing agents for the suspension-type polymerization of water soluble polymers. A number of processes are described in this patent for the preparation of suitable graft polymers, among them being a process having the steps of (1) preparing a copolymer having a reactive group, (2) forming an interpolymer having pendant double bonds by reacting the reactive group-containing copolymer with a compound having both a complementary reactive group and a double bond that can be polymerized, and (3) causing free radical polymerization of graft monomers to take place in the presence of the copolymer having pendant double bonds to form the graft polymer. It should be noted that patentee discloses only graft polymers, and, furthermore, he does not recognize the radiation-polymerizing and crosslinking potential of some of the hypothesized interpolymers. Patentee broadly states that the preparation of copolymers from, among other possibilities, interpolymers containing azlactone groups with compounds containing complementary reactive groups and a double bond is well known in the art. The present inventors have found no references in the scientific or patent literature to substantiate this statement. In addition, polymers disclosed by patentee are further reacted with the grafting monomers only in a solvent taking adequate precautions to remove oxygen from the system with the final product remaining soluble in said solvent, whereas, as will be discussed below, those polymers of the present invention are intended to be cast from solution and then intended to be insolubilized or crosslinked. Furthermore, we have found that the polymers are able to be insolubilized even in the presence of oxygen when derived from azlactone interpolymers containing greater than about 25 weight percent of the azlactone moiety.

SUMMARY OF THE INVENTION

The present invention provides compositions which are radiation-crosslinkable. These compositions may be applied to substrates to provide imaging systems or radiation curable binders and protective layers. These materials may have fast cure rates, insensitivity to oxygen and appreciable resistance to swelling by common solvents. These polymers, which can be cured rapidly even in the presence of air, have pendant ethylenically unsaturated (especially acrylic) peptide groups. The present invention further relates to a novel, rapid, efficient process for preparing these polymers and copolymers in the reaction of nucleophilic compounds having an ethylenically unsaturated group with polymers containing azlactone groups.

The energy-sensitive polymers of the present invention, which cure to crosslinked, insoluble polymers, are represented by substances V and VI in an overall process for preparing these radiation-curable polymers. A summary of these steps is as follows:

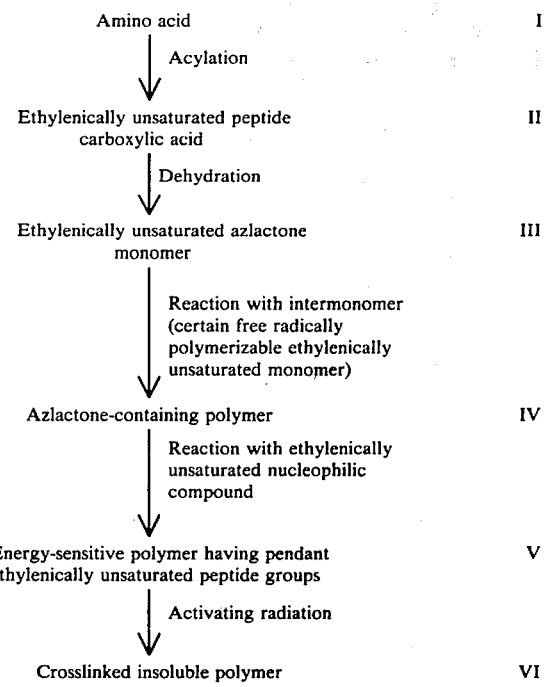

The present invention discloses the novel polymers designated V and VI and the method of their preparation, i.e. steps IV to V and V to VI.

DETAILED DESCRIPTION OF THE INVENTION

In accordance with the present invention, energy-sensitive polymers having pendant ethylenically unsaturated peptide groups are disclosed. The structure below is not intended to show polymers with only M units on one side and only units of the formula

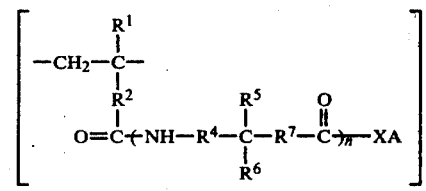

on the other side. The following structure should be read as indicating that the two types of units alternate in various random patterns throughout the polymer:

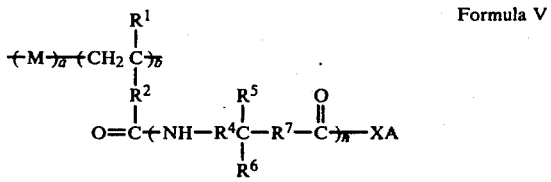

Formula V wherein

M is a copolymer unit derived from one or more monomers (e.g. any free radically polymerizable, ethylenically unsaturated monomer except those of the HXA type, because HXA type monomers cause an undesirable, premature insolubilization of the interpolymer, discussed in detail below) interpolymerizable with the ethylenically unsaturated azlactone monomer (III);

$R^1$ is hydrogen or methyl;

$R^2$ is selected from a single bond, $-R^3-$, and

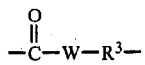

in which $R^3$ is alkylene having 1 to 12 carbon atoms, preferably 1 to 6 carbon atoms, and W is $-O-$, $-S-$ or $-NH-$;

$R^4$ and $R^7$ are independently selected from a single bond and methylene, or substituted methylene having 1 to 12 carbon atoms; $R^5$ and $R^6$ are independently alkyl or cycloalkyl having 1 to 12 carbon atoms, aryl or aralkyl having 6 to 12 carbon atoms or $R^5$ and $R^6$ taken together with the carbon to which they are joined form a 5— or 6—membered carbocyclic ring, or may be H when at least one of $R^4$ and $R^7$ is methylene;

n is 1, 2 or 3;

X is $-O-$, $-NH-$ or $-S-$;

A is a polymerizable, ethylenically unsaturated group selected from (a)

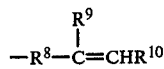

in which $R^8$ is an alkylene group having 1 to 12 carbon atoms, an arylene group having 6 to 10 carbon atoms, or an oxyalkylene group, $-OR)_p$ in which R is a lower alkylene group having 2 to 4 carbon atoms and p is 1 to 4; $R^9$ and $R^{10}$ are independently hydrogen, and alkyl group having 1 to 12 carbon atoms, or an aryl group having 6 to 10 ring positioned carbon atoms wherein aryl is defined as a phenyl or naphthyl moiety optionally having substitution thereon or (b) $-R^8-WY$ in which $R^8$ is as defined under the definition for A, W as defined under the definition for $R^2$, and Y is an ethylenically unsaturated group selected from the group including acryloyl, methacryloyl, cinnamoyl, maleoyl, fumaroyl, itaconoyl and crotonoyl and is preferably acryloyl or methacryloyl;

a and b are independent whole integer numbers, and b is at least 1, sufficient to provide the polymer with a weight percent of M units in the azlactone-containing interpolymer between about 0 and 90, preferably 0 and 75.

These energy-sensitive polymers of the invention are prepared by the reaction (conditions of the reaction are given below) of an ethylenically unsaturated nucleophilic compound, HXA, with the azlactone group of a polymer having pendant azlactone groups, which polymer (designated "azlactone polymer") is known in the art and consists essentially of 10 to 100 percent, preferably 25 to 100 percent, and most preferably 30 to 100 percent, by weight of units from one or more ethylenically unsaturated azlactone monomers and 90 to 0 percent, preferably 75 to 0 percent, and most preferably 70 to 0 percent, by weight of one or more vinyl monomers (designated intermonomers) interpolymerizable with the ethylenically unsaturated azlactone monomer in accordance with the equation:

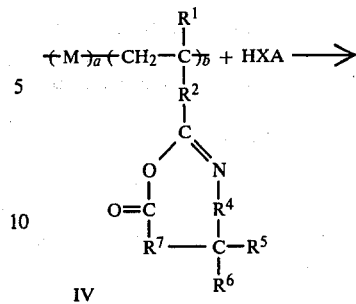

IV

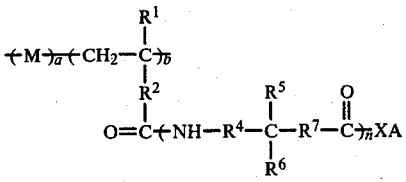

V

Equation E (See overall schematic diagram below)

wherein M, $R^1$, $R^2$, $R^4$, $R^5$, $R^6$, $R^7$, X, A, a and b are defined above for formula V, and n=1.

The preferred compositions of the invention are polymers of Formula V which are radiation curable in the presence of air. Such polymers become curable in air when they are derived from polymers containing greater than about 25 weight percent of azlactone monomer units. Polymers of Formula V containing less than about 25 weight percent of units derived from azlactone monomers are useful however, provided they are exposed to radiation in a nitrogen-blanketed atmosphere, discussed below under Example 2.

The HXA compounds are essentially any polymerizable, ethylenically unsaturated heteroatomic nucleophile containing an active hydrogen atom; these "active hydrogen" compounds are often referred to as Zerewitinoff compounds (cf. Kharasch and Reinmuth, *Grignard Reactions of Nonmetallic Substances*, pps 1166–1198, Prentice-Hall, Inc., Englewood Cliff, N.J., 1954). Suitable examples of HXA compounds are selected from the following classes of heteroatomic Zerewitinoff compounds:

Alcohols: including mono-hydroxyalkyl derivatives of α,β-unsaturated carboxylic acids such as 2-hydroxyethyl acrylate, 2-hydroxyethyl methacrylate, 3-hydroxypropyl acrylate, 3-hydroxybutyl acrylate, pentaerythritol triacrylate, trimethylolpropane dimethacrylate, N-(2-hydroxyethyl)acrylamide, 2-hydroxyethyl cinnamate, N-(2-hydroxyethyl)maleimide, methyl 2-hydroxyethyl fumarate, methyl 2-hydroxyethyl itaconate, methyl 2-hydroxyethyl maleate, polyoxyethylene glycol monoacrylate, polyoxypropylene glycol monomethacrylate, and the like; hydroxy-functional vinyl aromatic monomers such as 4-(2-hydroxyethyl)styrene, 4-(3-hydroxyethyl)-1′-methylstyrene, and the like; hydroxy-functional allylic monomers such as allyl alcohol, methallyl alcohol, diallyl 4-(2-hydroxyethyl)-o-phthalate, and the like; hydroxy-functional vinyl ethers such as 2-hydroxyethyl vinyl ether, 4-hydroxybutyl vinyl ether, and the like; and higher ethylenically unsaturated alcohols such as 9-octadecen-1-ol, and the like.

Primary amines: including amino-functional allylic compounds such as allyl amine, allyl 4-aminobenzoate, and the like; amino-functional vinyl ethers such as 2- aminoethyl vinyl ether, 4-aminobutyl vinyl ether, and the like.

Mercaptans: including mercaptoalkyl derivatives of α,β-unsaturated carboxylic acids such as 2-mercaptoethyl acrylate, N-(4-mercaptobutyl)acrylamide, and the like; mercapto-functional vinyl aromatic monomers such as 4-vinylthiophenol and the like; mercapto-functional allylic monomers such as allyl mercaptan and the like; mercapto-functional vinyl ethers such as 2-mercaptoethyl vinyl ether and the like.

The acrylic- and methacrylic-functional HXA compounds are generally preferred because of their availability and because of the increased rate of cure that they provide to the peptide group-containing polymers compared to the other polymerizable moieties listed above.

Reaction of the azlactone polymers and the HXA compound is conveniently accomplished by the addition of the HXA compound directly to a solution of the polymer or interpolymer. No additional ingredients are required for the primary amine HXA compounds, but catalysts are required for the reaction to proceed at a reasonable rate at room temperature with the alcohol and mercaptan HXA compounds. While the literature discloses that when the azlactone ring is to be opened with methanol or ethanol, for example, this is best accomplished using refluxing conditions in addition to Bronsted acid catalysts such as p-toluenesulfonic acid or phosphoric acid and tertiary amines, we have discovered that the above catalysts, as well as other Lewis acids, such as $BF_3$ etherate, $AlCl_3$, $SnCl_4$ and $TiCl_4$ function effectively as catalysts for the reaction at ambient temperatures. The progress of the ring-opening reaction can be conveniently followed by recording the infrared spectrum of the reaction mixture and observing the disappearance of the carbonyl stretching absorption at about 5.4 microns.

Referring back to U.S. Pat. No. 3,948,866 discussed above, patentee alludes to azlactone polymers to which are grafted complementary double bond-containing monomers. Patentee does not characterize in any way the resulting copolymers, but he does state that an object of his invention is the avoidance of crosslinking. In contrast to this prior art, the present invention discloses polymers having pendant ethylenically unsaturated peptide groups, the purpose of which is to undergo extensive crosslinking to form insoluble polymers wherein at least 10% of the ethylenically unsaturated peptide groups have undergone the radiation induced crosslinking reaction.

Preparation of polymers of Formula V wherein $n=2$ or 3 will be discussed below.

The polymers of Formula V having pendant ethylenically unsaturated peptide groups are "energy curable" to insoluble resins designated as VI above. By "energy curable" is meant the property of undergoing a crosslinking insolubilizing reaction when exposed to activating radiation. The activating radiation can be either thermal, electromagnetic (e.g. visible or ultraviolet) or ionizing (e.g. high energy electrons). An excellent discussion of these different forms of activating radiation can be found in W. J. Moore's text entitled *Physical Chemistry* (3rd edition, Prentice-hall, 1964, page 819).

When electromagnetic activating radiation is utilized, the procedure is often termed "photopolymerization". "Photopolymerization" can be divided into two fundamental classes, both of which are operative in the invention:

Class A:
These are photopolymerization reactions of certain ethylenically unsaturated compounds in which electromagnetic radiation is required for the *propagation* of the polymer-forming or crosslinking reaction to occur. Examples of polymerizable functional groups which undergo "Class A" reaction are cinnamoyl and maleimide groups.

Class B:
These are often termed "photoinitiated polymerizations" because the electromagnetic radiation is only necessary for *initiation* of the polymer-forming or crosslinking reaction to occur. Essentially all of the polymerizable functional groups with the exception of cinnamoyl and maleimide undergo the "Class B" reaction.

With the Class A systems it is unnecessary to have any other light absorbing species present other than the polymerizable moiety, while with the Class B systems it is necessary to add to the system a species capable of initiating the polymer-forming or crosslinking reaction. However, with both classes certain "sensitizers" may be added. These "sensitizers" are species that can transmit the light energy they have absorbed to the polymerizable moiety in the Class A system or to the species capable of initiating the polymer-forming or crosslinking reaction hereinafter termed "photoinitiator" in the Class B systems. This "sensitization" may be used advantageously in order to utilize light sources that generally emit lower energy radiation; the latter light sources are desirable in that they are less hazardous as far as accidental exposure to eyes and skin are concerned and they are also generally lower in cost. A more detailed account of "sensitizers" and "sensitization" is given in J. Kosar's text entitled *Light Sensitive Systems: Chemistry and Application of Nonsilver Halide Photographic Processes* (Wiley, 1964, pps. 5 and 185). Suitable sensitizers which may be utilized in the invention are cited in J. F. Rabek's article entitled "Photosensitized Processes in Polymer Chemistry: a Review" (*Photochemistry and Photobiology*, 7, 5, (1960), and are herein incorporated by reference. Also, suitable photoinitiators that can be added to the Class B systems are cited in G. Oster and N. Yang's article entitled "Photopolymerization of Vinyl Monomers" [Chem. Rev., 68, 125 (1968)]. Examples of such initiators are acyloins and derivatives thereof, such as benzoin, benzoin methyl ether, benzoin ethyl ether, benzoin isopropyl ether and α-methylbenzoin; diketones such as benzil and diacetyl, etc.; organic sulfides such as diphenyl sulfide, diphenyl disulfide, decyl phenyl sulfide and tetramethylthiurium monosulfide; S-acyl dithiocarbamates, such as S-benzoyl-N,N-dimethyldithiocarbamate, phenones such as acetophenone, α,α,α-tribromoacetophenone, α,α-diethoxyacetophenone, 2,2-dimethoxy-2-phenylacetophenone, 4'-nitro-2,2,2-tribromoacetophenone; benzophenone and p,p'-bis(dimethylamino)benzophenone; sulfonyl halides such as p-toluenesulfonyl chloride, 1-naphthalenesulfonyl chloride, 2-naphthalenesulfonyl chloride, 1,3-benzenedisulfonyl chloride, 2,4-dinitrobenzenesulfonyl bromide and p-acetamidobenzenesulfonyl chloride. It is also contemplated that conventional heat activated free radical catalysts such as organic peroxides and organic hydroperoxides, examples of which are benzoyl peroxide, tertiary-butyl perbenzoate, cumene hydroperoxide, azobis(isobutyronitrile) and the like, can be used in the invention.

Where ultraviolet or visible radiation is used to achieve the crosslinked insoluble polymers (VI) from the energy-sensitive polymers (V), suitable light sources include relatively low intensity lamps such as germicidal, blacklight, and even sunlight exposure, and the relatively high intensity lamps such as mercury lamps, tungsten lamps, xenon arcs and the like. As is apparent to one skilled in the art, there is an inverse relationship between exposure time and intensity of activating radiation. Thus, all of these light sources may be utilized with varying efficiencies in terms of length of exposure time to accomplish the polymer-forming or cross-linking reaction.

Ionizing radiation may also be utilized as the activating radiation to bring about the crosslinking, insolubilizing reaction. The ionizing radiation can either be electromagnetic or particulate in nature. Electromagnetic ionizing radiation includes primarily X-ray and gamma radiation, while particulate ionizing radiation includes primarily electron and nuclear radiation. Suitable sources for ionizing radiation include resonance chambers, Van de Graff generators, betatrons, synchrotons, cyclotrons, atomic piles, radioactive isotopes, and the like. While all of the various types of ionizing radiation can be utilized with the instant invention, the preferred ionizing radiation from economic and practical standpoints is the use of high energy accelerated electrons.

The energy-sensitive elements of the invention are prepared by coating a substrate with a solution of the energy-curable composition by any conventional means such as dip coating, roll coating, air-knife coating, gravure coating, curtain coating, spray coating, use of wire wound coating rods and the like. Typically, the substrate is coated with a layer that, after removal of solvent, has a thickness of about 10 micrometers to 10 millimeters or thicker (thickness depending on purpose of use of the element) or about 1 to 1000 grams per square meter.

The coating solutions are prepared directly by in situ reaction of azlactone polymer with the HXA compound. To this end, an azlactone containing interpolymer is dissolved typically at 10 to 50 percent solids by weight in a solvent having no nucleophilic groups, i.e. ethyl acetate, tetrahydrofuran, xylene and the like, or mixtures thereof. To this solution there is then added up to about 1.1 mole equivalents of HXA nucleophilic compound per azlactone equivalent and about 0.1 to 5 percent by weight of a Lewis acid based on polymer solids. The reaction solution is agitated for 2 to 24 hours, preferably 2 to 8 hours, at 20° to 30° C., until the reaction is complete as evidenced by the disappearance of the absorption band at about 5.4 microns in the infrared spectrum of the reaction mixture. At this point additional solvent may be added to achieve a desirable viscosity with the coating solution. Suitable diluting solvents include lower alcohols, e.g. ethanol; lower esters, e.g. ethyl acetate; cyclic ethers, e.g. tetrahydrofuran; lower halocarbons, e.g. methylene chloride; and the like.

For those articles that are to be prepared for use with visible or ultraviolet radiation, a photoinitiator is added to the coating composition. As previously discussed, photoinitiators suitable for use in the curable compositions of the invention are those compounds which liberate or generate a free radical on addition of energy, examples of which are given above. The purpose of these photopolymerization initiators in the practice of the present invention is to facilitate polymerization when the composition is irradiated. Normally the initiator is used in amounts ranging from about 0.01 to 5 percent by weight of the total polymerizable composition. When the quantity is less than 0.01 percent by weight, the polymerization rate becomes extremely low. If the initiator is used in excess of 5 percent by weight, no correspondingly improved effect can be expected. Thus, addition of such greater quantity is economically unjustified. Preferably, about 0.5 to 2 percent of initiator is used in the polymerizable compositions. The use of initiators is not necessary when curing is carried out with high energy electrons.

As previously mentioned, compositions represented by Formulas V and VI are novel in the art as are the processes of their preparation, Equations D and E below. An overall schematic diagram resulting in the essential compositions of this invention is as follows:

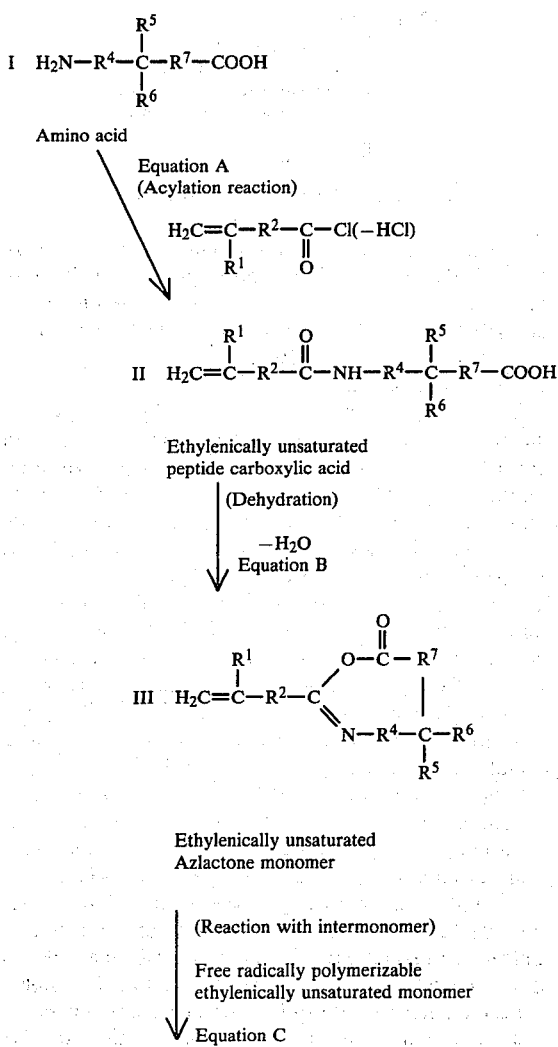

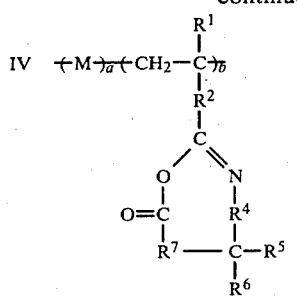

"Azlactone polymer"

(Polymer having pendant azlactone groups)

| HXA | Ethylenically unsaturated nucleophilic compound

↓ Equation D

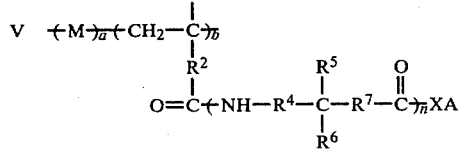

Energy-sensitive polymer having pendant ethylenically unsaturated peptide groups

| (if visible or ultraviolet radiation, use photoinitiator) Activating radiation (thermal, electromagnetic or ionizing)

↓ Equation E

VI  CROSSLINKED INSOLUBLE POLYMER

The process and compositions involved in Formulas I through IV and Equations A through C are well known in the art. In the practice of the present invention amino acids (Formula I) suitable for use in the preparation of the ethylenically unsaturated peptide carboxylic acids are 2,2-disubstituted amino acids.

These are subjected to acylation (Equation A) with suitable ethylenically unsaturated acylating agents resulting in the corresponding ethylenically unsaturated peptide carboxylic acids. The acylation with ethylenically unsaturated acylating agents such as acryloyl and methacryloyl chloride, shown in Equation A, is preformed in the manner described by Kulkari and Morawetz, J. Polymer Sci., 54. 491 (1961) by the portionwise addition of the acylating agent preferably containing a polymerization inhibitor such as hydroquinone or the like and an equivalent amount of an acid absorber (e.g. aqueous sodium hydroxide) to a vigorously stirred aqueous solution of an equivalent amount of an alkali metal salt of the amino acid at about 0° C. Generally a reaction time of 1 to 3 hours suffices to complete the reaction, after which the reaction mixture is neutralized with aqueous acid, such as 6 N HCl, and the ethylenically unsaturated peptide carboxylic acid isolated.

Exemplary ethylenically unsaturated acylating agents include acryloyl chloride, methacryloyl chloride, α-chloroacryloyl chloride, 3-butenoyl chloride, 5-hexenoyl chloride, acryloyloxyacetyl chloride, methacryloyloxyacetyl chloride, 2-(acryloyloxy)propionyl chloride, 3-acryloylthioxy)propionyl chloride 3-N-acryloyl-N-methylamino) propionyl chloride and the corresponding anhydrides.

The unsaturated peptide carboxylic acids thus formed can be used to prepare energy-sensitive polymers (Formula V) wherein $n=1$.

To prepare polymers of Formula V wherein $n=2$ requires use of ethylenically unsaturated azlactones, depicted by Formula III, as acylating agents to react with a suitable amino acid. Equation F shows the preparation of an ethylenically unsaturated dipeptide carboxylic acid.

Equation F

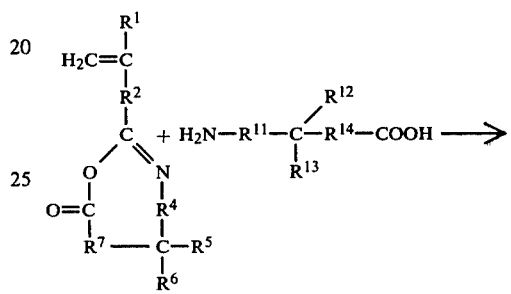

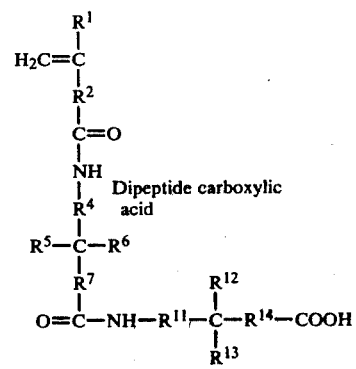

wherein $R^4$, $R^5$, $R^6$ and $R^7$ are as previously defined above for Formula V, $R^{11}$, $R^{12}$, $R^{13}$ and $R^{14}$ are the same as defined for $R^4$, $R^5$, $R^6$ and $R^7$ respectively.

A similar reaction, shown in Equation G, is used to prepare ethylenically unsaturated tripeptide carboxylic acids. These acids are necessary for the preparation of polymers of Formula V wherein $n=3$.

Equation G

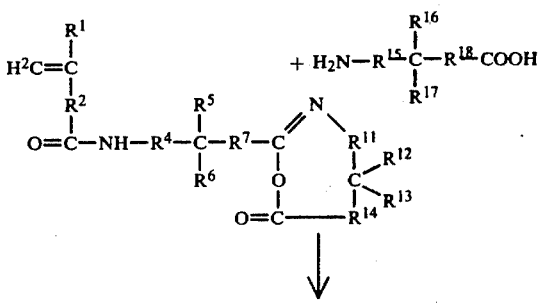

-continued
Equation G

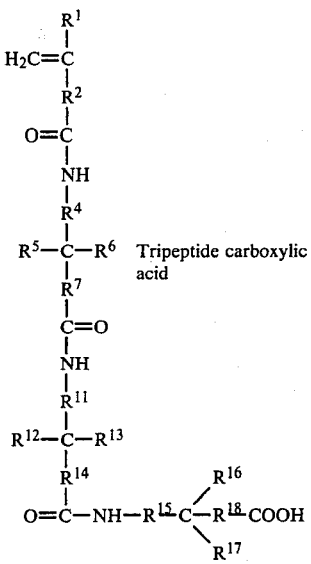

wherein $R^4$, $R^5$, $R^6$, $R^7$ are as defined above for Formula V and $R^{11}$, RHU 12, $R^{13}$, $R^{14}$ and $R^{15}$, $R^{16}$, $R^{17}$, $R^{18}$ are the same as $R^4$, $R^5$, $R^6$, $R^7$ respectively.

The formation of peptide units by the addition of amino acids to azlactone compounds is well known as the Bergmann azlactone peptide synthesis (see for example K. Hubner et al., *Angew. Makromol. Chemie*, 11, 109 (1970) and Bergmann et al., *Ann.*, 449, 227 (1926).

The ethylenically unsaturated azlactone monomers, Formula IV, are prepared by the dehydration of the ethylenically unsaturated peptide carboxylic acids just described in accordance with Equation C. This dehydration is carried out by stirring a mixture of the ethylenically unsaturated mono-, di- or tripeptide carboxylic acid and a dehydrating agent such as thionyl chloride, acetic anhydride or dicyclohexylcarbodiimide. A typical procedure involved dehydration with the carbodiimide reagent at about 0°–50° C. for about 1–24 hours, preferably in an inert solvent such as methylene chloride, and a polymerization inhibitor. The reaction mixture is then filtered and the cyclized product recovered, preferably by distillation at reduced pressure.

Examples of suitable ethylenically unsaturated azlactone monomers (Formula IV) include:
2-vinyl-4,4-dimethyl-2-oxazolin-5-one,
2-isopropenyl-4,4-dimethyl-2-oxazolin-5-one,
2-vinyl-4,4-diethyl-2-oxazolin-5-one,
2-vinyl-4,4-dibutyl-2-oxazolin-5-one,
2-vinyl-4-methyl-4-nonyl-2-oxazolin-5-one,
2-vinyl-4-methyl-4-dodecyl-2-oxazolin-5-one,
2-isopropenyl-4-methyl-4-phenyl-2-oxazolin-5-one,
2-isopropenyl-4-methyl-4-benzyl-2-oxazolin-5-one,
2-vinyl-4,4-pentamethylene-2-oxazolin-5-one,
2-isopropenyl-4,4-tetramethylene-2-oxazolin-5-one,
2-allyl-4,4-dimethyl-2-oxazolin-5-one,
2-[2-(N-methacryloylamide)ethyl]-4,4-dimethyl-2-oxazolin-5-one,
2-(2-acryloylthioxy)ethyl-4,4-dimethyl-2-oxazolin-5-one,
2-vinyl-4,4-dimethyl-1,3-oxazin-6-one
2-(2-acryloyloxy)isopropyl-4,4-dimethyl-2-oxazolin-5-one.
2-vinyl-4,5,6,7-tetrahydro-4,4-dimethyl-1,3-oxazepin-7-one The azlactone polymers (Formula IV) just described are converted to the ethylenically unsaturated polymers of Formula V by reaction with free radically polymerizable, ethylenically unsaturated nucleophiles, Equation D in the Schematic Diagram. The azlactone polymers (IV) may also be prepared by their interpolymerization with one or more intermonomers using procedures generally known in the polymerization art (see, for example, K. Huebner et al., *Angew. Makromol. Chem.*, 11, 109 (1970)). Fairly standard free radical polymerization conditions are utilized with these monomers except that solvents such as alcoholic solvents that could react with the azlactones by a ring opening addition reaction are to be avoided. Suitable solvents include ethyl acetate, toluene, xylene, acetone, methyl ethyl ketone, acetonitrile, tetrahydrofuran and the like, and combinations of these solvents.

Suitable free radical initiators for the polymerization reaction include azobis(isobutyronitrile), benzoyl peroxide, t-butyl hydroperoxide and the like.

Intermonomers suitable for interpolymerization with the ethylenically unsaturated azlactone monomers include essentially any free radically polymerizable ethylenically unsaturated monomers except those of the HXA type which have been previously described because these monomers cause an undesirable premature insolubilization of the interpolymer. Examples of suitable intermonomers include the vinyl aromatic monomers such as styrene, α-methylstyrene, 2- and 4-vinylpyridine, and the like; α,β-unsaturated carboxylic acids such as acrylic acid, methacrylic acid, itaconic acid, maleic acid, fumaric acid, crotonic acid, and the like; α,β-unsaturated carboxylic acid derivatives such as methyl methacrylate, butyl methacrylate, 2-ethylhexyl methacrylate, ethyl acrylate, butyl acrylate, iso-octyl acrylate, octadecyl acrylate, cyclohexyl acrylate, tetrahydrofurfuryl methacrylate, phenyl acrylate, phenethyl acrylate, benzyl methacrylate, β-cyanoethyl acrylate, maleic anhydride, diethyl itaconate, acrylamide, methacrylonitrile, N-butylacrylamide and the like; vinyl esters of carboxylic acids such as vinyl acetate, vinyl 2-ethylhexanoate and the like; vinyl halides such as vinyl chloride, vinylidene chloride and the like; vinyl alkyl ethers such as methyl vinyl ether, 2-ethylhexyl vinyl ether, butyl vinyl ether and the like; olefins such as ethylene; N-vinyl compounds such as N-vinylpyrrolidone, N-vinylcarbazole and the like; vinyl ketones such as methyl vinyl ketone and the like; and vinyl aldehydes such as acrolein, methacrolein and the like. The preferred intermonomers in the present invention are the α,β-unsaturated carboxylic acid derivatives. As is apparent to one skilled in the art, the above intermonomers can be utilized with the azlactone monomers alone or, as is often desirable, combinations of the above intermonomers can be utilized. The overall objective of formulation of the various intermonomers with the azlactone monomers that are subsequently reacted with the HXA compound is generally to obtain a polymer film that can be handled and imaged easily in the non-crosslinked form prior to treatment with the activating radiation.

As previously described, the azlactone polymers of Formula IV may be converted to the compositions of the invention, polymers of Formulas V and VI, by means of reactions described by Equations D and E.

The compositions of the invention can also include a variety of addenda utilized for their known purpose, such as stabilizers, inhibitors, lubricants, flexibilizers, pigments, dyes, reinforcing fillers such as finely divided silica, non-reinforcing fillers such as diatomaceous earth, metals, metal oxides, asbestos, fiberglass, glass bubbles, talc, etc. Where the polymerizing energy is electromagnetic radiation, it is desirable that the addenda be transparent to the radiation.

It is also contemplated as being within the scope of the invention that reactive diluents such as methyl methacrylate, ethylene diacrylate, hexanediol diacrylate, trimethylolpropane triacrylate, pentaerythritol tetracrylate and the like may be added advantageously to improve the rate and degree of the radiation induced crosslinking reaction.

The photocurable elements are particularly suitable for applications in the field of graphic arts because of their capability for forming high resolution images. Among such uses are solvent-developable resists for chemical milling, gravure images, offset plates, stencil making, screenless lithography, relief printing plates and printed circuits, and the like.

The invention is further illustrated by the following examples.

PREPARATION OF 2-ETHYLENICALLY UNSATURATED AZLACTONE MONOMERS

(a) Preparation of amino acids

1. Synthesis of hydantoin

Sodium cyanide (55 grams, 1.412 moles) and ammonium carbonate (96 grams, 3,253 moles) were dissolved in 1235 milliliters of water. 2-Undecanone (170 grams, 0.588 mole) dissolved in 1235 milliliters of ethanol was added, resulting in precipitation of a fine white solid. The mixture was stirred at room temperature for 4 hours and at 45° C. for 18 hours. Water (3500 milliliters) was added to the ivory colored suspension, and the mixture was filtered. The filter cake was washed well with water and dried. Yield: 138.9 grams (98 percent of theoretical) of 5-methyl-5-nonylhydantoin; melting range: 104°–106° C.

By substituting other ketones for 2-undecanone in the above reaction other 5,5-dialkylhydantoins were prepared.

2. Hydrolysis of hydantoin to the corresponding amino acid

The hydantoin prepared above (133 grams, 0.55 mole) was suspended in 1110 milliliters of 48 percent hydrobromic acid and refluxed gently for 18 hours. After cooling, the hydrobromic acid was removed at reduced pressure using a rotary evaporator. The solid residue remaining was dissolved in 660 milliliters of aqueous methanol (90 volume percent methanol), and the pH was adjusted to 6.5 with concentrated ammonium hydroxide. The resulting slurry was poured into 3500 milliliters of acetone, the resulting flocculent white solid collected by filtration and washed well with water and acetone. The nonylalanine obtained was further purified by recrystallization from methanol-water. Yield: 115 grams (97 percent); melting point: 264° C. (sealed tube).

By substituting other 5,5-dialkylhydantoins in the above reaction other amino acids were prepared. Many amino acids are available commercially and were used when practical in preparing the compositions and elements of the invention.

(b) Acylation of amino acids to form ethylenically unsaturated carboxylic acids Methylalanine (103 grams, 1.00 mole) was added to 40 grams (1 mole) of sodium hydroxide dissolved in 350 milliliters of water. Acryloyl chloride (86 grams, 0.95 mole) and sodium hydroxide (38 grams, 0.95 mole) dissolved in 75 milliliters of water were then added dropwise, each from their own dropping funnel, to the stirred reaction solution over the course of 30 minutes such that the reaction temperature did not exceed 5° C. The reaction solution was stirred an additional 10 minutes after the addition before acidification to pH 2 with concentrated hydrochloric acid. The white powder precipitate of N-acryloylmethylalanine was collected by filtration, washed well with water and dried. Yield: 131.5 grams (88 percent); melting point: 185°–186.5° C.

In a similar manner other ethylenically unsaturated peptide carboxylic acids were prepared by substituting other amino acids for methylalanine in the above reaction.

(c) Dehydration of ethylenically unsaturated peptide carboxylic acids to form azlactone monomers Finely divided N-acryloylmethylalanine (33 grams, 0.21 mole) was added to a stirred mixture of dicyclohexylcarbodiimide (41.2 grams, 0.2 mole) dissolved in 500 milliliters of methylene chloride. The reaction mixture was then stirred at 25° C. overnight. The dicyclohexylurea and slight excess of the N-acryloylmethylalanine employed were filtered, and the filtrate evaporated in vacuo. The light brown oily residue was then distilled at reduced pressure with a water-white fraction distilling at 63°–67° C. at 25 mm. pressure being collected. Yield: 22.8 grams (82 percent) of 2-vinyl-4,4-dimethyl-2-oxazolin-5-one.

By replacing N-acryloylmethylalanine with other unsaturated peptide carboxylic acids in the above reaction other azlactone monomers were obtained.

(d) Polymerization of azlactone monomers to form azlactone polymers

Into a reaction vessel equipped with a stirrer, thermometer, reflux condenser, means for heating and means for maintaining a nitrogen atmosphere in the vessel were charged

| 2-vinyl-4,4-dimethyl-2-oxazolin-5-one | 50 | parts |
|---|---|---|
| ethyl acetate | 75 | parts |
| azobis(iso-butyronitrile) | 0.15 | parts |

The solution was sparged with nitrogen and heated at 55° C. with agitation for 24 hours. After this time, the percent polymer solids in the solution obtained, as determined by a standard gravimetric procedure, was 37.9 percent and the inherent viscosity as measured in acetone (0.20 gram of polymer dissolved in 100 milliliters of acetone) and 30° C. was 0.82 deciliters per gram, corresponding to a weight average molecular weight of about 300,000.

In a similar manner other azlactone monomers or mixtures with one or more other intermonomers were polymerized. Table I lists various azlactone polymers that have been prepared

TABLE I

| Azlactone Polymer(a) (ratio(b) of monomers) | Viscosity(c) (<n>) |
| --- | --- |
| VDM | 0.82(d) |
| MM-VDM (90:10) | 0.62 |
| MM-VDM (80:20) | 0.68 |
| BA-VDM (50:50) | 0.21(d) |
| ST-VDM (60:40) | 0.34 |
| BA-IDM (50:50) | 0.06 |
| n-BMA-VMN (65:35) | 0.36 |
| i-BMA-n-BMA-VDM (54:20:26) | 0.46 |
| MM-VA-MA-BVE-VMP (50:10:2.5:2.5:35) | 0.44 |
| n-BMA-BA-VDM (80:10:10) | 0.35 |
| IOA-AM-VDM (55:5:40) | 0.35 |
| EA-NVP-VTM (55:10:35) | 0.89 |
| BMA-VDM (60:40) | 0.20 |
| i-BMA-BA-VDM (20:40:40) | 0.12 |
| BMA-IDM (60:40) | 0.07 |
| MM-VDM(6) (65:35) | 0.50 |

Notes:
(a) Abreviations used for monomeric components of the azlactone polymers are:
VDM 2-vinyl-4,4-dimethyl-2-oxazolin-5-one
MM methyl methacrylate
BA butyl acrylate
ST styrene
VA vinyl acetate
AM acrylamide
VMN 2-vinyl-4-methyl-4-nonyl-2-oxazolin-5-one
i-BMA iso-butyl methacrylate
n-BMA n-butyl methacrylate
IDM 2-isopropenyl-4,4-dimethyl-2-oxazolin-5-one
IOA iso-octyl acrylate
BVE butyl vinyl ether
EA ethyl acrylate
NVP N-vinylpyrrolidone
VTM 2-vinyl-4,4-tetramethylene-2-oxazolin-5-one
MA maleic anhydride
VDM(6) 2-vinyl-4,4-dimethyl-1,3-oxazin-6-one
(b) All ratios are on a weight-weight basis.
(c) Unless otherwise stated, all inherent viscosities were measured using 0.15 g. of polymer/100 ml. of tetrahydrofuran.
(d) Viscosity was measured using 0.20 g. polymer/10 ml. of solvent.

EXAMPLE 1

Reaction of azlactone polymers with HXA nucleophilic agents to form energy-curable polymers having pendant ethylenically unsaturated peptide groups To 13.3 grams of a tetrahydrofuran:ethyl acetate (1:2.3) solution of the n-butylacrylate:2-vinyl-4,4-dimethyl-2-oxazolin-5-one (50:50) interpolymer, designated BA-VDM (50:50) containing 5.3 grams of the interpolymer having 0.019 mole of pendant azlactone was added 2.5 grams (0.019 mole) of 2-hydroxyethyl methacrylate and 5 drops of BF$_3$ etherate. After stirring for 3 hours at 25° C., the reaction was complete as evidenced by the disappearance of the carbonyl stretching absorption band at about 5.4 microns in the infrared spectrum. Removal of the solvent produced a tack-free, energy-curable polymer having pendant methacryloyl peptide groups, designated BA-VDM (50:50)/HEMA.

In a similar manner other polymers of azlactone monomers and interpolymers of azlactone monomers with intermonomers were caused to react with various HXA agents to form various energy-curable, ethylenically unsaturated peptide group-containing polymers and coating solutions of the invention.

EXAMPLE 2

Preparation of Energy Sensitive Elements

A coating solution was prepared by dissolving 0.3 gram of Irgacure 651 (2,2-dimethoxy-2-phenylacetophenone, available from Ciba-Geigy) in a solution prepared as in Example 1 consisting of 30 grams of BA-VDM (50:50)/HEMA in 70 grams of ethyl acetate. The solution was then coated onto 100 micrometer polyester film using a No. 32 wire-wound coating rod. On air drying, a tack-free layer having a thickness of about 25 micrometers was obtained.

A metal image template was placed on the tack-free film, and the composite was exposed to activating radiation. Three different radiation conditions were utilized:

Condition 1:

The composite was exposed in a nitrogen blanketed atmosphere for one minute to a medium pressure mercury lamp through ⅛ inch Pyrex glass with a lamp-to-composite distance of 20 cm.

Condition 2:

The composite was exposed for one minute to a medium pressure mercury lamp in air with a lamp-to-composite distance of 15 cm.

Condition 3:

The composite was exposed to electron beam radiation using the ELECTROCURTAIN apparatus operated at 225 kilovolts with the various dose rates given in megarads (MR) designated in parentheses. The ELECTROCURTAIN apparatus is a linear cathode unit available from Energy Sciences, Inc., Bedford, Mass.

The exposed composite film was then allowed to soak in ethyl acetate to remove the non-exposed areas. The resultant image, when dry, had excellent resolution, showing sharp differentiation between exposed and nonexposed areas.

EXAMPLES 3–19

Example 2 was repeated using in palce of BA-VDM (50:50)/HEMA the various polymers having pendant ethylenically unsaturated peptide groups and exposure conditions shown in Table 2. The quality of the image obtained for each of the energy-curable constructions is also shown.

TABLE II

| Ex. No. | Energy-curable Polymer (d)/HXA(e) | Imaging Condition(f) | Image Quality(g) |
| --- | --- | --- | --- |
| 2 | BA-VDM (50:50)/HEMA | 2 | exc |
| 3 | VDM(100)/HEMA | 1 | exc |
| 4 | MM-VDM(90:10)/HEMA(h) | 1 | un |
| 5 | MM-VDM(90:10)/HEMA | 1 | exc |
| 6 | MM-VDM(80:20)/HEMA | 1 | exc |
| 7 | i-BMA-n-BMA-VDM(54:20:26)/HEMA | 2 | exc |
| 8 | EA-NVP-VTM(55:10:35)/HEMA | 2 | exc |
| 9 | i-BMA-n-BMA-VDM(54:20:26)/HPA | 3 (2MR) | exc |
| 10 | IOA-AM-VDM(55:5:40)/OD | 3 (4MR) | exc |
| 11 | ST-VDM(60:40)/HEMA | 2 | exc |
| 12 | BA-IDM(50:50)/HEMA | 2 | exc |
| 13 | n-BMA-VMN(65:35)/HEMA | 2 | exc |
| 14 | MM-VA-MA-BVE-VMP(50:10:2.5:2.5:35)/HEMA | 2 | exc |
| 15 | n-BMA-BA-VDM(80:10:10)/PETrA | 2 | exc |
| 16 | i-BMA-n-BMA-VDM(54:20:26)/AIM | 2 | ma |
| 17 | BA-VDM-(50:50)/MEA-FMMEE | 2 | exc |
| 18 | i-BMA-n-BMA(54:20:26)/HBVE | 2 | exc |
| 19 | BA-IDM(50:50)/MAlAM | 2 | exc |
| 20 | n-BMA-VDM(60:40)/HEMA | 2 | exc |
| 21 | i-BMA-BA-VDM(20:40:40)/HEMA | 2 | exc |
| 22 | n-BMA-IDM(60:40)/HEMA | 2 | exc |

TABLE II-continued

| Ex. No. | Energy-curable Polymer (d)/HXA(e) | Imaging Condition(f) | Image Quality(g) |
|---|---|---|---|
| 23 | MM-VDM(6) (65:35)/HEMA | 2 | exc |

Notes:
(d)Monomeric components of polymer are the same as defined in Table 1.
(e)Abbreviations for the ethylenically unsaturated nucleophilic agents used in forming the ethyleninically unsaturated peptide group of the polymer are:
HBVE - 4-hydroxybutyl vinyl ether
HEMA - 2-hydroxyethyl methacrylate
HEP - 3-hydroxypropyl acrylate
PETrA - pentaerylthritol triacrylate
AlM - allylmercaptan
MEA-FMMEE - adduct of 2-mercaptoethanol and fumaric acid monoethyl ester
OD - 9-octadecen-1-ol
MAlAM - methallylamine
(f)Exposure condition described in Exhibit 2.
(g)Image quality: exc is exceptional, ma is marginally acceptable and un is unacceptable.
(h)Only 50 mole percent of the azlactone group of the azlactone polymer was reacted with the HXA compound.

What is claimed is:

1. A composition comprising a radiation-curable polymer, said polymer being crosslinkable and having pendant ethylenically unsaturated peptide groups and the following structural formula

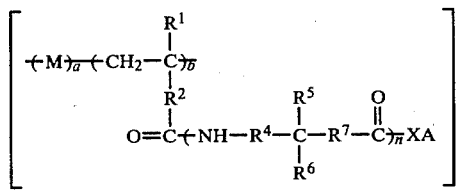

wherein
M is a unit from one or more free radically polymerizable ethylenically unsaturated monomers;
$R^1$ is hydrogen or methyl;
$R^2$ is selected from a single bond, $-R^3-$ and

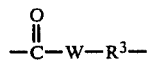

in which $R^3$ is alkylene having 1 to 12 carbon atoms, preferably 1 to 6 carbon atoms, and W is $-O-$, $-S-$ or $-NH-$;
$R^4$ and $R^7$ are independently selected from a single bond and methylene, or substituted methylene having 1 to 12 carbon atoms;
$R^5$ and $R^6$ are independently alkyl or cycloalkyl having 1 to 12 carbon atoms, aryl or aralkyl having 6 to 12 carbon atoms or $R^5$ and $R^6$ taken together with the carbon to which they are joined form a 5- or 6-membered carbocyclic ring, or may be H when at least one of $R^4$ and $R^7$ is methylene;
n is 1, 2 or 3;
X is $-O-$, $-NH-$ or $-S-$;
A is a polymerizable, ethylenically unsaturated group selected from
(a)

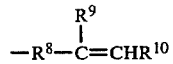

in which $R^8$ is an alkylene group having 1 to 12 carbon atoms, an arylene group having 1 to 12 carbon atoms, an arylene group having 6 to 10 carbon atoms, or an oxyalkylene group, $-(OR)_p$ in which R is a lower alkylene group having 2 to 4 carbon atoms and p is 1 to 4; $R^9$ and $R^{10}$ are independently hydrogen, an alkyl group having 1 to 12 carbon atoms, or an aryl group having 6 to 10 carbon atoms or (b) $-R^8WY$ in which $R^8$ is as defined under the definition for A, W as defined under the definition for $R^2$, and Y is an ethylenically unsaturated acyl group selected from the group including acryloyl, methacryloyl, cinnamoyl, maleoyl, fumaroyl, itaconoyl and crotonoyl;

a and b are independent whole integer numbers, and b is at least 1, sufficient to provide a polymer wherein the distribution of M units and

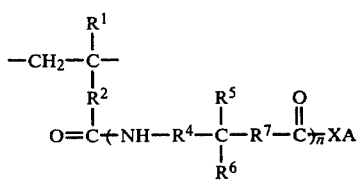

units is random throughout the polymer.

2. The composition according to claim 1 wherein A is $-R^8WY$ and Y is selected from the class of acryloyl and methacryloyl units.

3. The composition according to claim 1 wherein said polymer comprises at most 90 percent by weight of "M" units.

4. The composition according to claim 1 wherein said polymer comprises at most 75 percent by weight of "M" units.

5. The composition according to claim 1 wherein said polymer comprises at most 70 percent by weight of "M" units.

6. The composition according to claim 1 wherein said polymer comprises at least 10 weight percent of units derived from ethylenically unsaturated azlactone monomers.

7. The composition according to claim 1 wherein said polymer comprises at least 25 weight percent of units derived from ethylenically unsaturated azlactone monomers.

8. The compositions according to claim 1 wherein said polymer comprises at least 30 weight percent of units derived from ethyylenically unsaturated azlactone monomers.

9. The composition according to claim 1 wherein said polymer is radiation-curable in air.

10. The composition according to claim 1 wherein said polymer is derived from
(a) one or more "M" monomers selected from the group consisting of
butyl acrylate,
methyl methacrylate
iso-butyl methacrylate,
n-butyl methacrylate,
ethyl acrylate,
N-vinylpyrrolidone,
iso-octyl acrylate,
acrylamide,
styrene,
vinyl acetate,
maleic anhydride,
butyl vinyl ether, (b) an azlactone monomer selected from the group consisting of
2-vinyl-4,4-dimethyl-2-oxazolin-5-one,
2-vinyl-4,4-tetramethylene-2-oxazolin-5-one,
2-isopropenyl-4,4-dimethyl-2-oxazolin-5-one,
2-vinyl-4-methyl-4-nonyl-2-oxazolin-5-one,
2-vinyl-4-methyl-4-phenyl-2-oxazolin-5-one,
2-vinyl-4-methyl-4-phenyl-2-oxazolin-5-one,
2-vinyl-4,5-dihydro-4,4-dimethyl-1,3-oxazin-6-one
2-vinyl-4,5,6,7-tetrahydro-4,4-dimethyl-1,3-oxazepin-7-one (c) and HXA units selected from the group consisting of
2-hydroxyethyl methacrylate,
3-hydroxypropyl acrylate,
9-octadecen-1-ol,
pentaerythritol triacrylate.

11. The composition according to claim 1 wherein the weight ratio of "M" units to peptide units is between 9:1 and 0:10, respectively.

12. The composition according to claim 1 further containing a solvent.

13. The composition according to claim 12 wherein the polymer is dissolved in a solvent such that the solution contains approximately 10–50 percent by weight of the polymer.

14. The method of preparing a radiation-curable polymer, said polymer being crosslinkable and having pendant ethylenically unsaturated peptide groups and the following structural formula

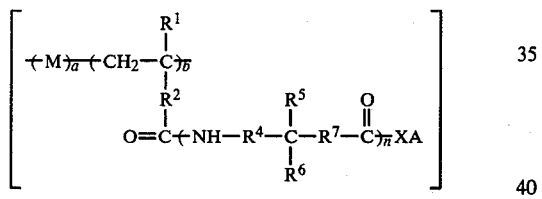

wherein
M is a unit from one or more free radically polymerizable ethylenically unsaturated monomers;
$R^1$ is hydrogen or methyl;
$R^2$ is selected from a single bond, —$R^3$— and

in which $R^3$ is alkylene having 1 to 12 carbon atoms, preferably 1 to 6 carbon atoms, and W is —O—, —S— or NH—;
$R^4$ and $R^7$ are independently selected from a single bond and methylene, or substituted methylene having 1 to 12 carbon atoms;
$R^5$ and $R^6$ are independently alkyl or cycloalkyl having 1 to 12 carbon atoms, aryl or aralkyl having 6 to 12 carbon atoms or $R^5$ and $R^6$ taken together with the carbon to which they are joined form a 5- or 6-membered carbocyclic ring, or may be H when at least one of $R^4$ and $R^7$ is methylene;
n is 1, 2 or 3;
X is —O—, —NH— or —S—;
A is a polymerizable, ethylenically unsaturated group selected from
(a)

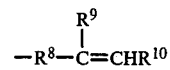

in which $R^8$ is an alkylene group having 1 to 12 carbon atoms, an arylene group having 1 to 12 carbon atoms, an arylene group having 6 to 10 carbon atoms, or an oxyalkylene group, —(OR)—$_p$ in which R is a lower alkylene group having 2 to 4 carbon atoms and p is 1 to 4; $R^9$ and $R^{10}$ are independently hydrogen, an alkyl group having 1 to 12 carbon atoms, or an aryl group having 6 to 10 carbon atoms or (b) —$R^8$WY in which $R^8$ is as defined under the definition for A, W as defined under the definition for $R^2$, and Y is an ethylenically unsaturated acyl group selected from the group including acryloyl, methacryloyl, cinnamoyl, maleoyl, fumaroyl, itaconoyl and crotonoyl;

a and b are independent whole integer numbers, and b is at least 1, sufficient to provide a polymer wherein the distribution of M units and

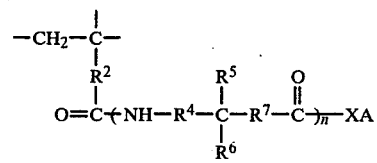

units is random throughout the polymer, which method includes the steps of
a. blending together in a non-nucleophilic solvent
(1) an ethylenically unsaturated nucleophilic compound of the formula HXA wherein
H is hydrogen;
X is —O—, —NH— or —S—;
A is a polymerizable, ethylenically unsaturated group selected from
(a)

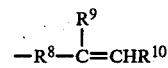

in which $R^8$ is an alkylene group having 1 to 12 carbon atoms, an arylene group having 6 to 12 carbon atoms, or an oxyalkylene group, —(OR)—$_p$ in which R is a lower alkylene group having 2 to 4 carbon atoms and p is 1 to 3; $R^9$ and $R^{10}$ are independently hydrogen, an alkyl group having 1 to 12 carbon atoms, or an aryl group having 6 to 10 carbon atoms or (b) —$R^8$—WY in which $R^8$ is as defined under the definition for $R^2$, and Y is an ethylenically unsaturated acryl group selected from the group including acryloyl, methacryloyl, cinnamoyl, maleoyl, fumaroyl, itaconoyl and crotonoyl, and (2) a polymer having pendant azlactone groups, said polymer resulting from interpolymerization of
(a) 10 to 100 percent by weight of units from one or more ethylenically unsaturated azlactone monomers, and
(b) 90 to 0 percent by weight of one or more vinyl monomers, and
(3) 0 to 5 percent by weight of a Lewis acid catalyst and
b. reacting components (1) and (2).

* * * * *

UNITED STATES PATENT AND TRADEMARK OFFICE
CERTIFICATE OF CORRECTION

PATENT NO. : 4,304,705

DATED : December 8, 1981

INVENTOR(S) : Steven M. Heilmann, Frederick J. Palensky and Jerald K. Rasmussen

It is certified that error appears in the above—identified patent and that said Letters Patent is hereby corrected as shown below:

Column 6, line 23, replace "Equation E" with --- Equation D ---.

Column 13, line 26, replace "RHU 12" with --- $R^{12}$ ---.

Column 13, line 35, replace "Formula IV," with --- Formula III, ---.

Column 13, line 37, replace "Equation C" with --- Equation B ---.

Column 13, line 50, replace "(Formula IV)" with --- (Formula III) ---.

Signed and Sealed this

Twenth-eighth Day of September 1982

[SEAL]

Attest:

GERALD J. MOSSINGHOFF

Attesting Officer

Commissioner of Patents and Trademarks